(12) United States Patent
Classen et al.

(10) Patent No.: US 8,530,982 B2
(45) Date of Patent: Sep. 10, 2013

(54) MICROMECHANICAL STRUCTURE, METHOD FOR MANUFACTURING A MICROMECHANICAL STRUCTURE, AND USE OF A MICROMECHANICAL STRUCTURE

(75) Inventors: Johannes Classen, Reutlingen (DE); Christian Bierhoff, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 245 days.

(21) Appl. No.: 12/924,160

(22) Filed: Sep. 21, 2010

(65) Prior Publication Data
US 2011/0079863 A1 Apr. 7, 2011

(30) Foreign Application Priority Data
Oct. 7, 2009 (DE) .......................... 10 2009 045 421

(51) Int. Cl.
*H01L 29/84* (2006.01)
(52) U.S. Cl.
USPC ............... 257/415; 257/254; 438/50; 438/52; 324/244

(58) Field of Classification Search
USPC .......................................................... 257/415
See application file for complete search history.

(56) References Cited

U.S. PATENT DOCUMENTS

2009/0139330 A1* 6/2009 Pavelescu et al. ......... 73/514.32
2009/0184781 A1* 7/2009 Ni ................................. 333/175

FOREIGN PATENT DOCUMENTS

DE 102 37 410 8/2003
DE 102007033001 A1 * 1/2009

\* cited by examiner

*Primary Examiner* — Ajay K Arora
(74) *Attorney, Agent, or Firm* — Kenyon & Kenyon LLP

(57) ABSTRACT

A micromechanical structure which includes a substrate having a main plane of extension, and a seismic mass which is movable relative to the substrate. The micromechanical structure includes a fixed electrode which is connected to the substrate, and a counterelectrode which is connected to the seismic mass. The fixed electrode has a first fixed electrode region and a second fixed electrode region which is connected in an electrically conductive manner to the first fixed electrode region. The counterelectrode is partially situated between the first and the second fixed electrode region, perpendicular to the main plane of extension.

20 Claims, 1 Drawing Sheet

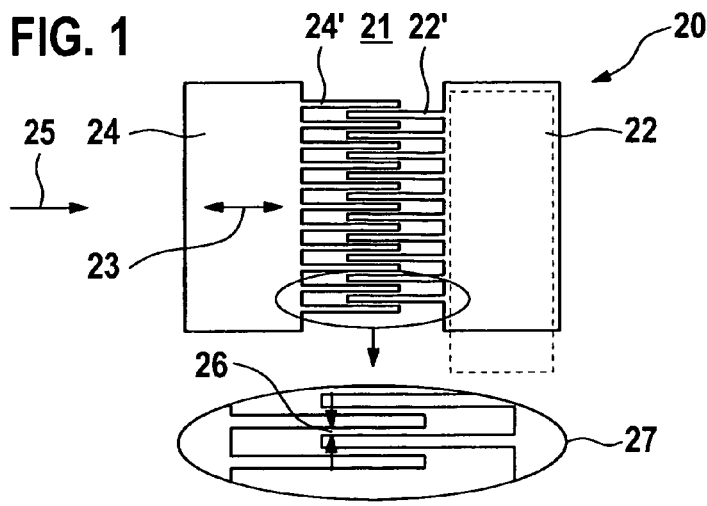
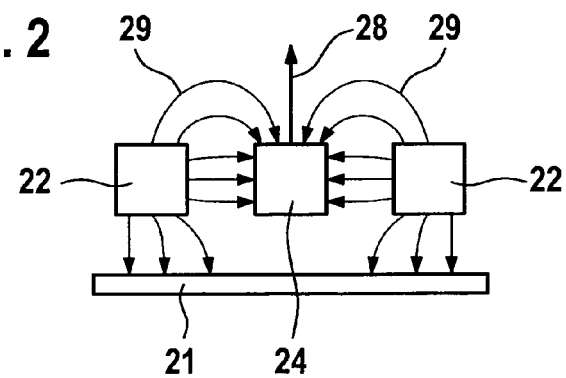
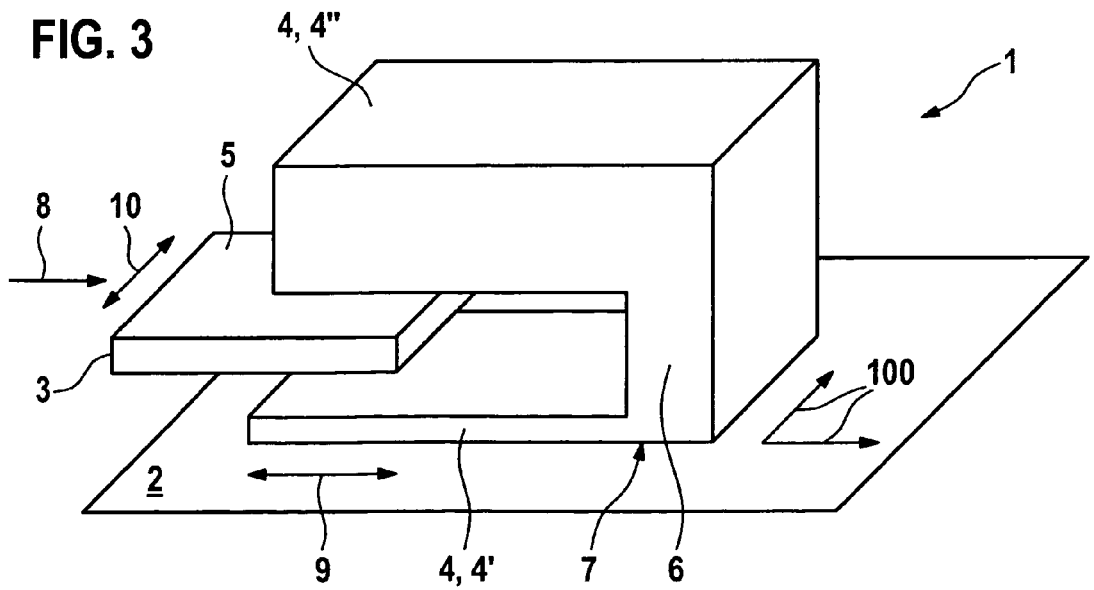

MICROMECHANICAL STRUCTURE, METHOD FOR MANUFACTURING A MICROMECHANICAL STRUCTURE, AND USE OF A MICROMECHANICAL STRUCTURE

BACKGROUND OF THE INVENTION

1. Field of the Invention

The present invention is directed to a micromechanical structure.

2. Description of Related Art

Such micromechanical structures are generally known. For example, a yaw rate sensor having Coriolis elements is known from published German patent application document DE 102 37 410 A1, the Coriolis elements being excited to vibrations parallel to a first axis with the aid of drive structures, and deflections of the Coriolis elements due to Coriolis forces acting on the Coriolis elements perpendicularly to the first axis being detected by detection structures. The drive structures and detection structures include micromechanical structures, the drive structures being designed in the form of comb Structures. The comb structures include a fixed comb and a movable comb which are situated essentially in the same plane, parallel to the substrate. The fixed comb and the movable comb each have multiple finger electrodes which interlock parallel to a drive direction. The drive force parallel to the drive direction has an inverse dependency on the distances between the finger electrodes of the movable comb and the finger electrodes of the fixed comb. The possible minimum distance is limited by the micromechanical manufacturing process, which has a lower structuring limit. In addition, the micromechanical manufacturing process has a variation in the manufacture of the micromechanical structure, as the result of which the distance between the finger electrodes varies within certain limits. Furthermore, the micromechanical structure has an asymmetry since that much more space is available above than below the drive structures. As a result, the drive structure exerts on the seismic mass not only a drive force parallel to the substrate, but also a so-called levitation force perpendicular to the substrate. As a result, the seismic mass undergoes a so-called levitation motion perpendicular to the substrate which is undesirably superimposed on the detection motion caused by the Coriolis forces.

SUMMARY OF THE INVENTION

The micromechanical structure according to the present invention and the method according to the present invention for manufacturing a micromechanical structure, as well as the use of the micromechanical structure according to the present invention according to the other independent claims, have the advantage over the related art that on the one hand, the efficiency or the sensitivity of the micromechanical structure is increased, and on the other hand, the levitation forces are significantly reduced. The efficiency or sensitivity is increased due to the fact that much smaller minimum distances between the counterelectrode and the fixed electrode may be achieved along a direction which is perpendicular to the main plane of extension, thus increasing the electrostatic interactions between the counterelectrode and the fixed electrode. Also as a result of the increase in efficiency or sensitivity for the same electrostatic interaction force between the fixed electrode and the counterelectrode, a much smaller substrate surface for the micromechanical structure according to the present invention is required compared to the related art. The installation space is more compact and the manufacturing costs are reduced. A reduction in the levitation forces is achieved by situating the fixed electrode on both sides of the counterelectrode, perpendicular to the main plane of extension, and thus increasing the symmetry of the micromechanical structure according to the present invention perpendicular to the main plane of extension. An additional advantage of the micromechanical structure according to the present invention over the related art is that the structures of the micromechanical structure may be manufactured with greater precision, since the manufacturing-related variations are usually much greater parallel to the main plane of extension than perpendicular to the main plane of extension. As a result, electrostatic interactions between the counterelectrodes and the fixed electrode may be adjusted and/or detected much more precisely. The substrate preferably includes a semiconductor substrate, and particularly preferably includes a silicon substrate, while the seismic mass, the counterelectrode, and/or the fixed electrode preferably include polysilicon and/or epitactic silicon.

Exemplary embodiments of the present invention are illustrated in the drawings and explained in greater detail in the following description.

BRIEF DESCRIPTION OF THE DRAWINGS

FIG. 1 schematically shows a top view of a comb electrode structure according to the related art.

FIG. 2 schematically shows a sectional view of a comb electrode structure according to the related art.

FIG. 3 schematically shows a perspective view of a micromechanical structure according to an example of one specific embodiment of the present invention.

DETAILED DESCRIPTION OF THE INVENTION

According to one preferred specific embodiment, it is provided that the first fixed electrode region is provided as a printed conductor on the substrate. Thus, the first fixed electrode region may advantageously be manufactured in a comparatively simple and cost-effective manner in a standard semiconductor manufacturing process. A design of the first fixed electrode region in the form of a printed conductor has the additional advantage that a comparatively low installation height perpendicular to the main plane of extension, combined with comparatively good electrical conductivity, may be achieved. The printed conductor preferably includes a polysilicon. Alternatively, the printed conductor may be implemented using metal.

According to one preferred specific embodiment, it is provided that the second fixed electrode region is connected in an electrically conductive manner to the first fixed electrode region with the aid of a connecting region, the connecting region extending essentially perpendicularly to the main plane of extension, and the connecting region being situated at a distance from the counterelectrode, parallel to the main plane of extension. Thus, the same electrical potential is advantageously ensured at the first and the second fixed electrode region, and at the same time an electrical short circuit between the fixed electrode and the counterelectrode is effectively prevented.

According to one preferred specific embodiment, it is provided that the micromechanical structure has multiple fixed electrodes and multiple counterelectrodes. Thus, the electrostatic interaction between the counterelectrode and the fixed electrode may be easily adjusted in an advantageous manner. In other respects, such an adjustment is made, for example, via the selection of the overlap length between the counterelectrode and the fixed electrode, by the selection of the distance between the counterelectrode and the fixed electrode, and/or by the selection of the thickness of the counterelectrode perpendicular to the main plane of extension.

According to one preferred specific embodiment, it is provided that a first distance between the first fixed electrode region and the counterelectrode, perpendicular to the main plane of extension, is essentially equal to a second distance between the second fixed electrode region and the counterelectrode, perpendicular to the main plane of extension. The symmetry of the micromechanical structure perpendicular to the main plane of extension is thus advantageously maximized, so that essentially no levitation forces occur perpendicularly to the main plane of extension. Undesired deflections of the seismic mass perpendicular to the main plane of extension are thus avoided.

According to one preferred specific embodiment, it is provided that the micromechanical structure includes a drive structure and/or a detection structure, the micromechanical structure preferably including a drive structure and/or a detection structure of a sensor element, particularly preferably an acceleration sensor element and/or a yaw rate sensor element. Thus, in particular a comparatively efficient and thus compact drive structure for driving the seismic mass may advantageously be achieved, via which comparatively high drive forces on the seismic mass may be generated. On the other hand, it is also possible to achieve an efficient and compact detection structure for detecting a motion of the seismic mass, thus achieving a comparatively high detection sensitivity and therefore high measuring accuracy.

An additional subject matter of the present invention is a method for manufacturing a micromechanical structure, the substrate being provided in a first method step, the first fixed electrode region being provided on the substrate in a second method step, a first sacrificial layer being provided on the first fixed electrode region in a third method step, the counterelectrode being provided on the first sacrificial layer in a fourth method step, a second sacrificial layer being provided on the counterelectrode in a fifth method step, the second fixed electrode region being provided on the second sacrificial layer in a sixth method step, and the first and/or the second sacrificial layer being etched in a seventh method step. The method according to the present invention advantageously allows a comparatively precise manufacture of the micromechanical structure, so that smaller distances between the counterelectrode and the fixed electrodes may be achieved. As a result, a micromechanical structure may be implemented which has a much greater efficiency or sensitivity compared to the related art, and also in which the undesired levitation forces are reduced. In addition, the manufacturing-related variations are reduced, thus increasing the structural precision of the micromechanical structure. As a result, a design of the micromechanical structure as a detection structure, for example, reduces the variation in the detection sensitivity. The first and the second sacrificial layer preferably include oxide layers, and particularly preferably include silicon dioxide layers. To increase the symmetry, the thickness of the first sacrificial layer perpendicular to the main plane of extension is preferably essentially the same as the thickness of the second sacrificial layer. The seventh manufacturing step preferably includes a gas phase etching process. The substrate is preferably also coated with an insulation layer prior to the first method step.

According to one preferred specific embodiment, it is provided that the first sacrificial layer and/or multiple first sacrificial layers is/are deposited and structured in the third method step, and/or the second sacrificial layer and/or multiple second sacrificial layers is/are deposited and structured in the fifth method step, the multiple first and/or second sacrificial layers preferably having different material thicknesses and/or different structurings. The multiple first sacrificial layers advantageously have different thicknesses and/or different structurings, and/or the multiple first sacrificial layers have different thicknesses and/or different structurings, so that the geometry of the various electrode regions may advantageously be freely adjusted and have differing designs.

According to one preferred specific embodiment, it is provided that, in an eighth method step, the first and/or the second sacrificial layer is/are etched at least in one contact region, the eighth method step preferably being carried out prior to the fourth and/or sixth method step. In the eighth manufacturing step, the first and/or the second sacrificial layer is/are advantageously removed at least in the contact region, so that the connecting region may be provided in the contact region within the scope of the sixth method step. Only the remaining first and second sacrificial layers (outside the contact region) are then removed in the seventh method step. An electrically conductive contact between the first and the second fixed electrode region is thus easily established in an advantageous manner.

An additional subject matter of the present invention is the use of a micromechanical structure for driving the seismic mass relative to the substrate, and/or as a detection structure for detecting a motion of the seismic mass relative to the substrate. Thus, as described in detail above, compared to the related art a much greater efficiency in driving the seismic mass and/or a much greater sensitivity in detecting a motion of the seismic mass may advantageously be achieved.

FIG. 1 schematically shows a top view of a comb electrode structure 20 according to the related art, comb electrode structure 20 having a first comb 22 which is fixedly connected to a substrate 21, and a second comb 24 which is movable relative to first comb 22 along a drive direction 23. First comb 22 includes multiple first finger electrodes 22', while second comb 24 has multiple second finger electrodes 24'. First and second finger electrodes 22', 24', are offset with respect to one another perpendicular to drive direction 23, and interlock along drive direction 23. An electrostatic interaction is generated between first and second finger electrodes 22', 24' as a result of a difference in potential between first and second combs 22, 23, which causes a drive force 25 to act on second comb 24 parallel to drive direction 23 and in the direction of first comb 22. The lower part of FIG. 1 shows an enlarged illustration of a detail 27 of first and second combs 22, 24. The magnitude of drive force 25 is inversely proportional to distance 26 in each case between first and second finger electrodes 22', 24'. Distance 26 is illustrated in enlarged partial view 27 of comb electrode structure 20. Drive force 25 ($F_{comb}$) results in particular from $$F_{comb} = \frac{N\varepsilon_0 h}{d} U^2,$$

where N is the number of second finger electrodes 24', h is the thickness of second finger electrodes 24' perpendicular to substrate 21, d is distance 26, and U is the electrical voltage between first and second finger electrodes 22', 24'. Alternatively, such a comb electrode structure 20 is also used as a detection structure, a motion of second comb 24 relative to first comb 22, for example, due to an external inertial or Coriolis force, causing a change in the electrical capacitance between first and second finger electrodes 22', 24' which is evaluated by analyzing electrical voltage U.

FIG. 2 schematically shows a sectional view of a comb electrode structure 20 according to the related art, comb electrode structure 20 being similar to comb electrode structure 20 illustrated in FIG. 1 and is shown only to illustrate a levitation force 28 in a sectional view. Second comb 24 is situated between two first combs 22, parallel to substrate 21. Due to the proximity of substrate 21, there is much more space on a side of second comb 24 facing away from substrate 21 than on a side of second comb 24 facing substrate 21. As a result, an electrical voltage U between second comb 24 and one of first combs 22 also exerts a force component, so-called levitation force 28, on second comb 24 perpendicular to substrate 21. The electrical field between second comb 24 and first combs 22 due to electrical voltage U is schematically illustrated by arrows 29.

FIG. 3 schematically shows a perspective view of a micromechanical structure 1 according to an example of one specific embodiment of the present invention, micromechanical structure 1 including a substrate 2 having a main plane of extension 100, and a seismic mass 3. Seismic mass 3 is movably supported relative to substrate 2. Micromechanical structure 1 also includes a counterelectrode 5 mounted on seismic mass 3, and a fixed electrode 4 mounted on substrate 2. Fixed electrode 4 includes a first fixed electrode region 4' and a second fixed electrode region 4". Counterelectrode 5 is situated, at least partially, between first and second fixed electrode regions 4', 4", perpendicular to main plane of extension 100, a first distance between first fixed electrode region 4' and counterelectrode 5, perpendicular to main plane of extension 100, being essentially equal to a second distance between second fixed electrode region 4" and counterelectrode 5, perpendicular to main plane of extension 100. First and second fixed electrode regions 4', 4" are connected to one another in an electrically conductive manner or electrically short-circuited with the aid of a connecting region 6 which extends perpendicularly to main plane of extension 100, from first fixed electrode region 4' to second fixed electrode region 4". Connecting region 6 is situated at a distance from counterelectrode 5, between first and second fixed electrode regions 4', 4" along a direction parallel to main plane of extension 100, so that the freedom of motion of seismic mass 3 parallel to main plane of extension 100 is not limited. An electrical voltage U between counterelectrode 5 and fixed electrode 4 produces a drive force 8 which acts on seismic mass 3 parallel to main plane of extension 100 in the direction of connecting region 6, and which is computed in particular from $$F_{vertical} = \frac{\varepsilon_0 b_{vert}}{d_{ox}} U^2,$$

where $b_{vert}$ is width 10 of counterelectrode 5 parallel to main plane of extension 100 and perpendicular to drive force 8, and $d_{ox}$ is equal to the first and the second distance. FIG. 3 also shows overlap length 9 of counterelectrode 5 and fixed electrode 4 parallel to drive force 8. Substrate 2 preferably includes a wafer substrate which in particular is monocrystalline, and/or a polycrystalline silicon layer. Counterelectrode 5, connecting region 6, and second fixed electrode region 4" also preferably include polycrystalline silicon layers, while first fixed electrode region 4' preferably includes a polysilicon printed conductor. The manufacture of micromechanical structure 1 includes in particular a first method step for providing substrate 2, a second method step for depositing first fixed electrode region 4' on substrate 2, a third method step for depositing a first sacrificial layer, in particular a first oxide layer on first fixed electrode region 4', a fourth method step for depositing counterelectrode 5 on the first sacrificial layer, a fifth method step for depositing a second sacrificial layer, in particular a second oxide layer, a sixth method step for depositing second fixed electrode region 4" on the second sacrificial layer, and a final seventh method step for etching the first and the second sacrificial layer, thus exposing counterelectrode 5 and second fixed electrode region 4". The first and the second sacrificial layer are deposited and structured in the third and fifth method steps, respectively. First fixed electrode region 4' includes in particular a contact region 7 in which the first and the second sacrificial layer are etched in an eighth method step carried out prior to the sixth method step, so that connecting region 6 for connecting first and second fixed electrode regions 4', 4" in an electrically conductive manner is provided in contact region 7 in the sixth method step. Micromechanical structure 1 is used in particular as a drive structure for driving seismic mass 3 relative to substrate 2, or alternatively, as a detection structure for detecting a motion of seismic mass 3 relative to substrate 2, the drive structure or detection structure preferably being implemented in a micromechanical yaw rate sensor. Substrate 2 is preferably coated with an insulation layer prior to the first method step.

What is claimed is:

1. A micromechanical structure comprising:
   a substrate having a seismic mass which is movable relative to the substrate;
   a fixed electrode which is connected to the substrate and has a first fixed electrode region at least partially covering the substrate and a second fixed electrode region connected in an electrically conductive manner to the first fixed electrode region and at least partially covering both the substrate and the first fixed electrode region; and
   a counterelectrode which is connected to the seismic mass and situated, at least partially, between the first and the second fixed electrode region, wherein when the micromechanical structure is viewed in a direction normal to a plane of the substrate that is at least partially covered by the first fixed electrode region, the second fixed electrode region at least partially covers the counterelectrode which at least partially covers the first fixed electrode region which at least partially covers the substrate.

2. The micromechanical structure as recited in claim 1, wherein the first fixed electrode region is provided as a printed conductor on the substrate.

3. The micromechanical structure as recited claim 1, wherein the second fixed electrode region is connected in an electrically conductive manner to the first fixed electrode region with the aid of a connecting region, the connecting region extending essentially perpendicularly to the plane of the substrate that is at least partially covered by the fixed electrode and the counterelectrode, and the connecting region being situated at a distance from the counterelectrode, parallel to the plane of the substrate that is at least partially covered by the fixed electrode and the counterelectrode.

4. The micromechanical structure as recited claim 2, wherein the second fixed electrode region is connected in an electrically conductive manner to the first fixed electrode region with the aid of a connecting region, the connecting region extending essentially perpendicularly to the plane of the substrate that is at least partially covered by the fixed electrode and the counterelectrode, and the connecting region being situated at a distance from the counterelectrode, parallel to the plane of the substrate that is at least partially covered by the fixed electrode and the counterelectrode.

5. The micromechanical structure as recited in claim 1, wherein the micromechanical structure has multiple fixed electrodes and multiple counterelectrodes.

6. The micromechanical structure as recited in claim 2, wherein the micromechanical structure has multiple fixed electrodes and multiple counterelectrodes.

7. The micromechanical structure as recited in claim 3, wherein the micromechanical structure has multiple fixed electrodes and multiple counterelectrodes.

8. The micromechanical structure as recited in claim 1, wherein a first distance between the first fixed electrode region and the counterelectrode, perpendicular to the plane of the substrate that is at least partially covered by the fixed electrode and the counterelectrode, is essentially equal to a second distance between the second fixed electrode region and the counterelectrode, perpendicular to the plane of the substrate that is at least partially covered by the fixed electrode and the counterelectrode.

9. The micromechanical structure as recited in claim 2, wherein a first distance between the first fixed electrode region and the counterelectrode, perpendicular to the plane of the substrate that is at least partially covered by the fixed electrode and the counterelectrode, is essentially equal to a second distance between the second fixed electrode region and the counterelectrode, perpendicular to the plane of the substrate that is at least partially covered by the fixed electrode and the counterelectrode.

10. The micromechanical structure as recited in claim 3, wherein a first distance between the first fixed electrode region and the counterelectrode, perpendicular to the plane of the substrate that is at least partially covered by the fixed electrode and the counterelectrode, is essentially equal to a second distance between the second fixed electrode region and the counterelectrode, perpendicular to the plane of the substrate that is at least partially covered by the fixed electrode and the counterelectrode.

11. The micromechanical structure as recited in claim 5, wherein a first distance between the first fixed electrode region and the counterelectrode, perpendicular to the plane of the substrate that is at least partially covered by the fixed electrode and the counterelectrode, is essentially equal to a second distance between the second fixed electrode region and the counterelectrode, perpendicular to the plane of the substrate that is at least partially covered by the fixed electrode and the counterelectrode.

12. The micromechanical structure as recited in claim 1, wherein the micromechanical structure includes at least one of a drive structure and a detection structure.

13. The micromechanical structure as recited in claim 12, wherein the at least one of the drive structure and the detection structure is of a sensor element.

14. The micromechanical structure as recited in claim 13, wherein the sensor element is a yaw rate sensor element.

15. A method for manufacturing a micromechanical structure as recited in claim 1, wherein the substrate is provided, the first fixed electrode region is provided on the substrate, at least one first sacrificial layer is provided on the first fixed electrode region, the counterelectrode is provided on the first sacrificial layer, at least one second sacrificial layer is provided on the counterelectrode, the second fixed electrode region is provided on the second sacrificial layer, and at least one of the first and the second sacrificial layer are etched.

16. The method as recited in claim 15, wherein at least one of the at least one first sacrificial layer and the at least one second sacrificial layer are deposited and structured.

17. The method as recited in claim 16, wherein at least one of the at least one first sacrificial layer and the at least one second sacrificial layer have different material thicknesses or different structurings.

18. The method as recited in claim 16, wherein at least one of the first and the second sacrificial layer is etched, at least in one contact region.

19. The method as recited in claim 18, wherein the etching is carried out before providing the counterelectrode on the first sacrificial layer or before the second fixed electrode region is provided on the second sacrificial layer.

20. A micromechanical structure as recited in claim 1, which is a drive structure for driving the seismic mass relative to the substrate, or which is a detection structure for detecting a motion of the seismic mass relative to the substrate.

\* \* \* \* \*